US012627296B2

(12) United States Patent (10) Patent No.: US 12,627,296 B2

Wang et al. (45) Date of Patent: May 12, 2026

(54) PROGRAMMABLE LOGIC CIRCUIT

(71) Applicant: SHENZHEN PANGO MICROSYSTEMS CO.,LTD, Shenzhen (CN)

(72) Inventors: Changlong Wang, Shenzhen (CN); Peifu Shen, Shenzhen (CN); Kang Yu, Shenzhen (CN); Beibei Liu, Shenzhen (CN); Heng Zhang, Shenzhen (CN); Min Zhang, Shenzhen (CN); Qipan Fu, Shenzhen (CN)

(73) Assignee: SHENZHEN PANGO MICROSYSTEMS CO.,LTD, Shenzhen (CN)

( * ) Notice: Subject to any disclaimer, the term of this patent is extended or adjusted under 35 U.S.C. 154(b) by 0 days.

(21) Appl. No.: 18/652,778

(22) Filed: May 1, 2024

(65) Prior Publication Data

US 2024/0372551 A1 Nov. 7, 2024

(30) Foreign Application Priority Data

May 6, 2023 (CN) .......................... 202310506585.3

(51) Int. Cl.
*H03K 19/17728* (2020.01)
*H03K 19/173* (2006.01)

(52) U.S. Cl.
CPC ... *H03K 19/17728* (2013.01); *H03K 19/1737* (2013.01)

(58) Field of Classification Search
CPC ......... H03K 19/17728; H03K 19/1737; Y02D 10/00; G06F 15/7867
USPC .......................... 326/39, 44; 365/149, 189.08
See application file for complete search history.

(56) References Cited

U.S. PATENT DOCUMENTS 5,349,250 A * 9/1994 New .................. H03K 19/1737
365/189.08
5,386,156 A * 1/1995 Britton ............. H03K 19/17728
327/407

* cited by examiner

*Primary Examiner* — Arnold M Kinkead

(57) ABSTRACT

The application discloses a programmable logic circuit, which comprising: a first lookup table circuit for generating and outputting a first output signal based on a received input signal; a second lookup table circuit for generating a carry propagation signal and a carry generation signal based on a received input signal, selecting one of the signals as the output; a first selection circuit for receiving a carry input signal and a carry generation signal, selecting one of the signals as the output based on the carry propagation signal; a second selection circuit for receiving a first output signal and a second output signal, selecting one of the signals as the output based on the selection output signal. The circuit provided in this application includes the addition operation of multivariate functions, which improves the configuration flexibility and logic resource utilization efficiency of programmable logic devices in addition operation mode.

11 Claims, 10 Drawing Sheets

Carry output signal

Carry propagation signal

01

Carry generation signal

Carry input signal

PROGRAMMABLE LOGIC CIRCUIT

CROSS-REFERENCE TO RELATED APPLICATIONS

This application claims priority to Chinese Patent Application No. CN202310506585.3, filed on May 6, 2023, the entire contents of which are incorporated herein by reference.

FIELD OF THE DISCLOSURE

The invention relates to the field of programmable integrated circuit technology, specifically to a programmable logic circuit.

BACKGROUND

The programmable logic circuit based on look up table (LUT) is the basic logic module of programmable logic device, it has the advantages of short development cycle, low cost, small risk, high integration, and great flexibility, and is widely used in communication, internet, automobile, aerospace and other fields.

The existing programmable logic circuit is shown in FIG. 1, when the programmable logic circuit is used as an adder, the carry input signal of the adder can only be input from port A4, resulting in the need to consume logic resources outside of the programmable logic circuit when the carry generation signal of the programmable logic circuit is a multivariate function, resulting in low resource utilization efficiency.

SUMMARY

In view of the above issues, this application provides a programmable logic circuit to solve the above mentioned technical problems.

A programmable logic circuit, comprises:

a first lookup table circuit, the first lookup table circuit is used for generating a first output signal based on a received input signal and outputting the first output signal;

a second lookup table circuit, the second lookup table circuit is used for generating and outputting a carry propagation signal and a carry generation signal based on a received input signal, and selecting the carry propagation signal or the carry generation signal as a second output signal to output;

a first selection circuit, the first selection circuit is used for receiving a carry input signal and the carry generation signal, and selecting the carry input signal or the carry generation signal as a carry output signal based on the carry propagation signal;

a second selection circuit, the second selection circuit is used for receiving the first output signal and the second output signal, and selecting the first output signal or the second output signal as a third output signal based on the selection output signal.

Further, the first lookup table circuit comprises a first five input lookup table and a third selection circuit, the first to fourth input ends of the first five input lookup table are respectively used for receiving the first to fourth input signals, a fifth input end of the first five input lookup table for receiving a signal output by the third selection circuit, an output end of the first five input lookup table is used for outputting the first output signal;

the third selection circuit is used for receiving a fifth input signal and the carry input signal, and to selecting the fifth input signal or the carry input signal to output.

Further, the third selection circuit is also used for receiving a cascade input signal to select one of the cascade input signal, the fifth input signal, and the carry input signal to output to a fifth input end of the first five input lookup table;

the second selection circuit is also used for using the selected the first output signal or the second output signal as a cascade output signal.

Further, the second lookup table circuit comprises:

a second five input lookup table, the first to fourth input ends of the second five input lookup table are respectively used for receiving the first to fourth input signals, a fifth input end of the second five input lookup table is used for receiving a fifth input signal, a first output end of the second five input lookup table is used for outputting the carry propagation signal, a second output end of the second five input lookup table is used for outputting the carry generation signal, and a third output end of the second five input lookup table is used for outputting the second output signal.

Further, the second lookup table circuit further comprises:

a fourth selection circuit, the fourth selection circuit is used for receiving the fifth input signal and a cascade input signal, selecting the fifth input signal or the cascade input signal to output, the signal output from the fourth selection circuit is used for determining the signal output from the third output end of the second five input lookup table.

Further, the fourth selection circuit is also used for receiving a sixth input signal to select one of the sixth input signal, the fifth input signal, and the cascade input signal to output to a fifth input end of the second five input lookup table.

Further, the first selection circuit comprises:

a first multiplexer, a first input end of the first multiplexer for receiving the carry generation signal, a second input end of the first multiplexer for receiving the second output signal, a selection end of the first multiplexer for receiving the carry propagation signal, and an output end of the first multiplexer for selecting the carry generation signal or the carry input signal as a carry output signal to output based on the carry propagation signal;

the second selection circuit comprises:

a second multiplexer, a first input end of the second multiplexer for receiving the first output signal, a second input of the second multiplexer for receiving the second output signal, a selection end of the second multiplexer for receiving the selection output signal, and the output end of the second multiplexer for selecting the first output signal or the second output signal as a third output signal to output based on the selection output signal.

Further, the third selection circuit comprises:

a third multiplexer, a first input end of the third multiplexer for receiving the fifth input signal, a second input end of the third multiplexer for receiving the carry input signal, and a third input end of the third multiplexer for receiving the cascade input signal, an output end of the third multiplexer for selecting one of the fifth input signal, the carry input signal, and the cascade input signal to output to the fifth input end of the first five input lookup table.

Further, the fourth selection circuit comprises:

a fourth multiplexer, a first input end of the fourth multiplexer for receiving the fifth input signal, a second input end of the fourth multiplexer for receiving the sixth input signal, a third input end of the fourth multiplexer for receiving the cascade input signal, and an output of the fourth multiplexer for selecting one of the fifth input signal, the sixth input signal, and the cascade input signal to output to a fifth input of the second five input lookup table.

Further, the selection ends of the third multiplexer and the fourth multiplexer are both programmed to control the signal output from their output end, the programming methods of the selection ends at least include SRAM programming, Flash programming, fuse programming and anti fuse programming.

The programmable logic circuit provided in this application is configured with a second lookup table circuit to output a carry propagation signal and a carry generation signal, so that when the programmable logic circuit is used as an adder, the carry generation signal is no longer limited to a single input variable and can perform addition operations on multivariate functions, improving the configuration flexibility and logic resource utilization efficiency of the programmable logic device in addition operation mode.

When the programmable logic circuit provided in this application is used as an adder, the first output signal of the first lookup table circuit is the result of the addition operation, and the second output signal of the second lookup table circuit can be one of the addends of the addition operation, by selecting the first output signal or the second output signal to output through the second selection circuit, the programmable logic circuit can choose to output the result of the addition operation or the addition value of the addition operation.

The programmable logic circuit provided in this application has a first lookup table circuit that can directly output a first output signal, the second lookup table circuit can directly output the second output signal, and the second selection circuit can select the first output signal or the second output signal as the third output signal to output, achieving independent output of the first lookup table circuit and the second lookup table circuit, so that the programmable logic circuit can be configured to include up to three outputs.

BRIEF DESCRIPTION OF THE DRAWINGS

In order to better illustrate the embodiments of the present application or the technical solutions in the prior art, a brief introduction will be made to the accompanying drawings required in the description of the embodiments. Obviously, the accompanying drawings in the following description are only some embodiments of the present application. For those skilled in the art, other drawings can be obtained from these drawings without paying creative labor.

DETAILED DESCRIPTION OF PREFERRED EMBODIMENTS

In order to enable those skilled in the art to better understand the scheme of the application, the technical scheme in the embodiment of the application will be clearly and completely described below in combination with the drawings in the embodiment of the application. Obviously, the described embodiments are only part of the embodiments of the application, not all of them. Based on the embodiments in the application, all other embodiments obtained by those skilled in the art without creative work fall within the scope of protection of the application.

In the embodiment of the present application, it should be noted that in this paper, relational terms such as first and second are only used to distinguish one entity or operation from another entity or operation, and do not necessarily require or imply any such actual relationship or order between these entities or operations.

In addition, "multiple" in the embodiment of the application refers to two or more. In view of this, "multiple" can also be understood as "at least two" in the embodiment of the application. "At least one" can be understood as one or more, such as one, two or more, for example, including at least one means including one, two or more, and it is not limited to which ones are included. For example, including at least one of A, B and C, then including can be A, B, C, A and B, A and C, B and C, A and B and C.

It should be noted that "connection" in the embodiment of the application can be understood as electrical connection, and the connection of two electrical elements can be a direct or indirect connection between two electrical elements. For example, the connection between A and B can be either direct or indirect through one or more other electrical components.

The programmable logic circuit based on look up table (LUT) is the basic logic module of the programmable logic device. It has the advantages of short development cycle, low cost, small risk, high integration, and great flexibility, and is widely used in communication, internet, automobile, aerospace and other fields.

Figure 1:
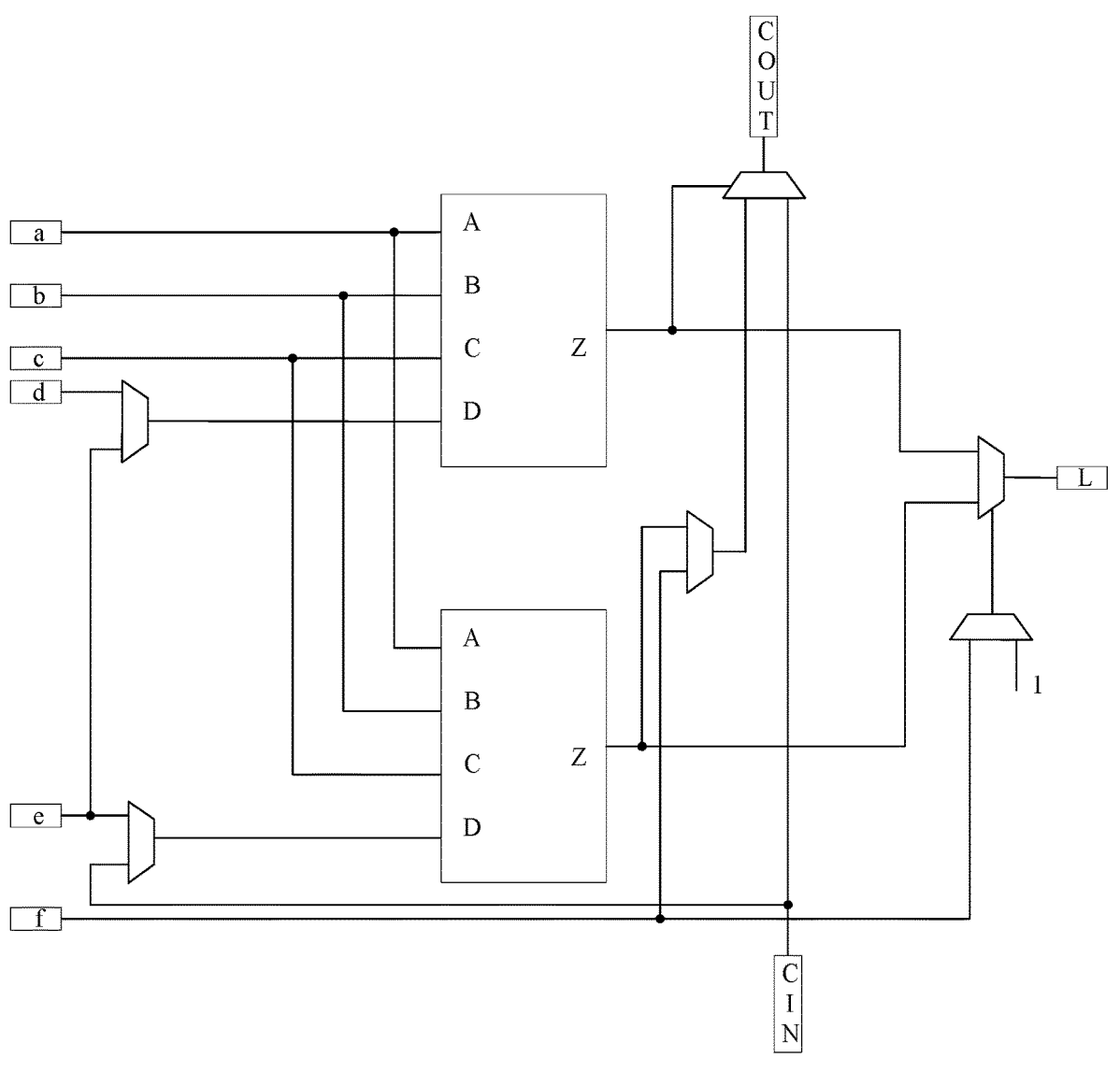
FIG. 1 illustrates a diagram of the prior art provided in the present embodiment.

Fig. 1 illustrates a diagram of the prior art provided in the present embodiment, this circuit consists of two four input lookup tables, several multiplexers, and a data selector, it includes six input ends (a-f) and one output end (L). Through this circuit, a five input function or a restricted six input function can be achieved, this circuit can also serve as a primary arithmetic comparator or as a primary adder. When performing addition operations through this circuit, the carry generation signal of each stage of the adder needs to be input from port f. At this time, when the carry generation signal is a multivariate function, the multivariate function cannot be absorbed by the lookup table, so external logic resources can only be used to process the multivariate function.

Further, an N-input look up table can be recursively defined as including two N-1 input look up tables and an one out of two data selector. However, in the technology shown in FIG. 1, simply increasing the size of the look up table to achieve a six input look up table can not eliminate the inherent efficiency defect in its addition operation, and when it is used as an arithmetic comparator, it can still be used as a comparator, and the problem of low resource utilization efficiency will be more obvious.

Figure 2:
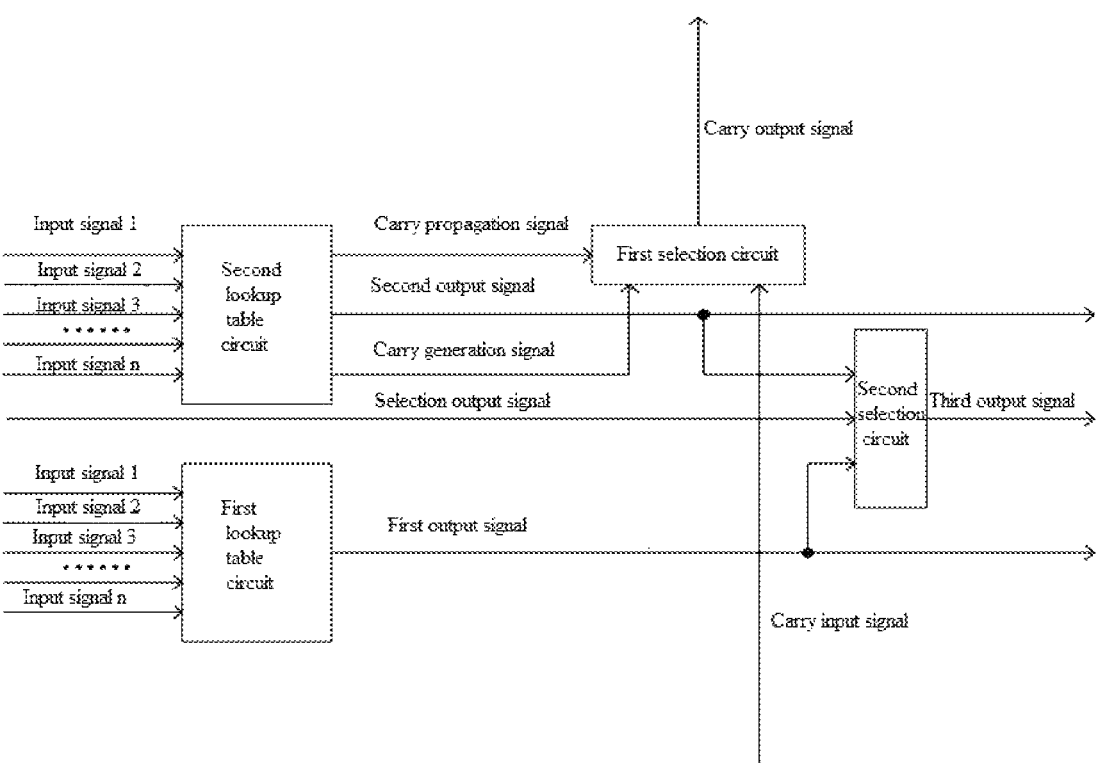
FIG. 2 illustrates a block diagram of a programmable logic circuit provided in the present embodiment.

In view of this, the present embodiment provides a programmable logic circuit. FIG. 2 illustrates a block diagram of a programmable logic circuit provided in the present embodiment, as shown in FIG. 2, the programmable logic circuit includes a first lookup table circuit, a second lookup table circuit, a first selection circuit, and a second selection circuit.

The first lookup table circuit is used for generating a first output signal based on the received input signal and outputting the first output signal. Specifically, the value of the first output signal generated by the first lookup table circuit is determined by the value of the received input signal.

Figure 3:
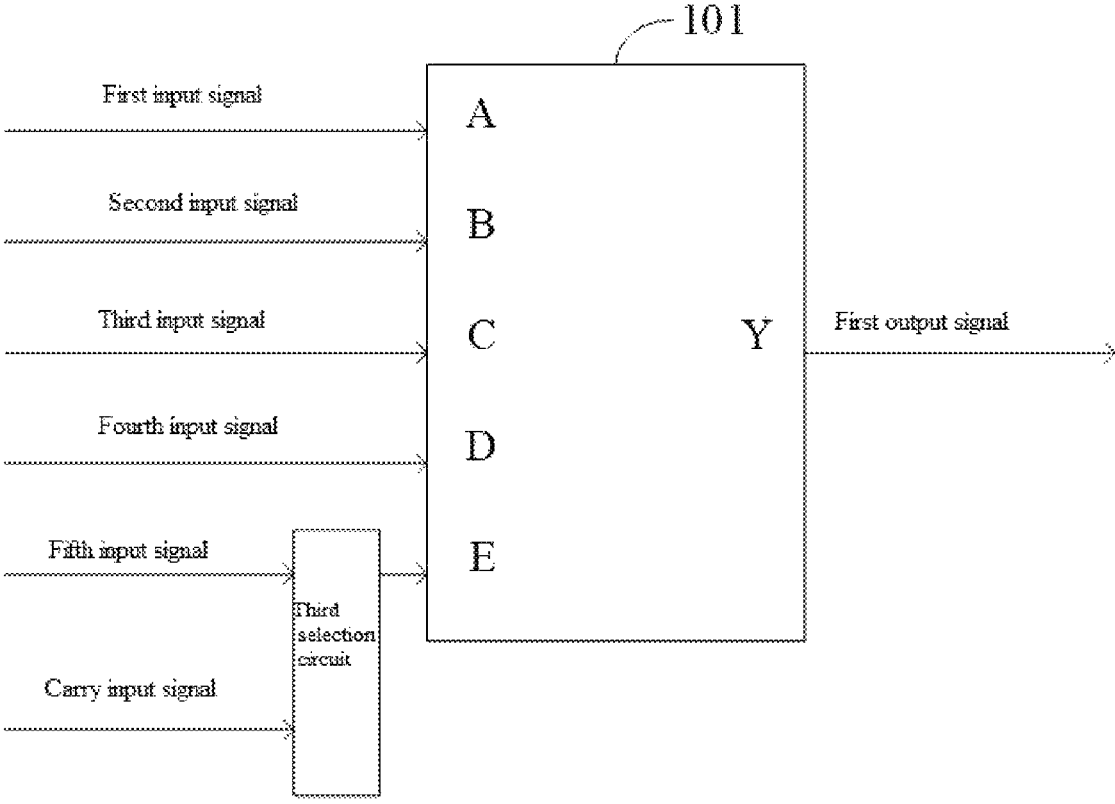
FIG. 3 illustrates a schematic diagram of the first lookup table circuit provided in the present embodiment.

In the embodiment, FIG. 3 illustrates a schematic diagram of the first lookup table circuit provided in the present embodiment, as shown in FIG. 3, the first lookup table circuit comprises a first five input lookup table 101 and a third selection circuit;

the first to fourth input ends (A, B, C, D) of the first five input lookup table are respectively used for receiving the first to fourth input signals, a fifth input end E of the first five input lookup table 101 is used for receiving a signal output by the third selection circuit, an output end Y of the first five input lookup table 101 is used for outputting the first output signal;

the third selection circuit is used for receiving a fifth input signal and the carry input signal, and selecting the fifth input signal or the carry input signal to output.

the input end of the third selection circuit is used for receiving the fifth input signal and the carry input signal, so as to select the fifth input signal or the carry input signal to output to the fifth input end E of the first five input lookup table 101.

In the present embodiment, the first lookup table circuit determines the value of the output first output signal based on the received input signal. The first lookup table circuit is not always applied to the first to fifth inputs in any application, when the programmable logic circuit in the present embodiment is used as an adder to perform two binary number addition, it is only applied to two input ends receiving the addition value, and one input terminal receiving the carry input signal. Based on the carry input signal, the output end of the first lookup table circuit outputs the addition sum.

Figure 4:
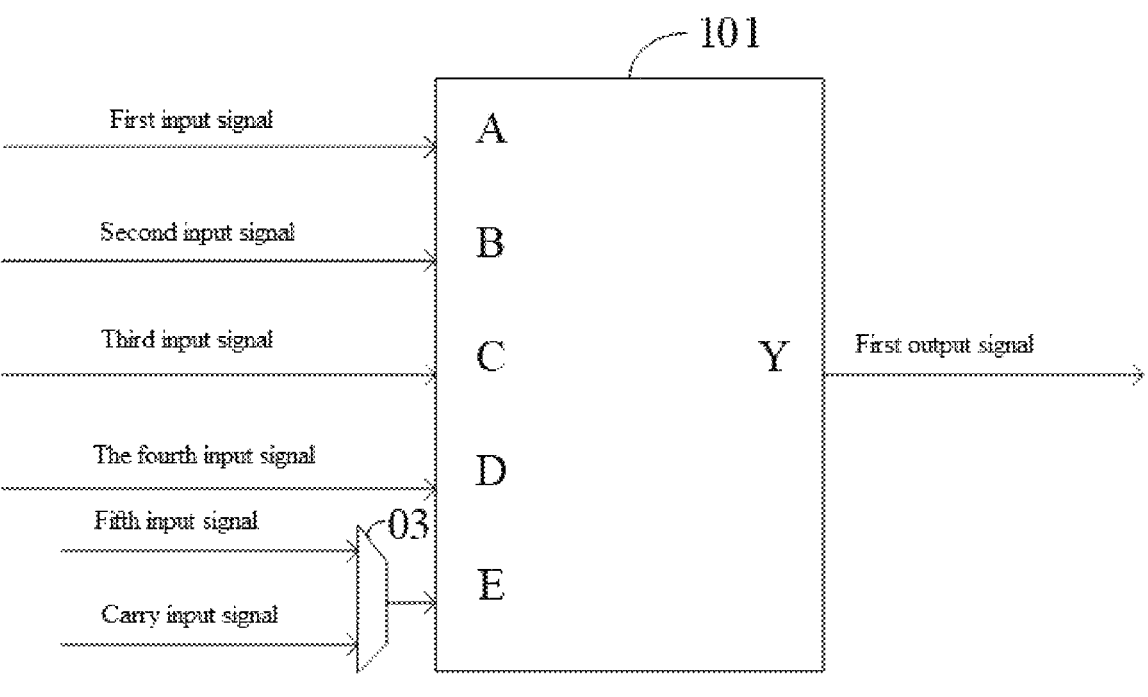
FIG. 4 illustrates another schematic diagram of the first lookup table circuit provided in the present embodiment.

In the embodiment, FIG. 4 illustrates another schematic diagram of the first lookup table circuit provided in the present embodiment, as shown in FIG. 4, the third selection circuit includes a third multiplexer 03, whose input end is used for receiving the fifth input signal and carry input signal. The output end of the third multiplexer 03 is connected to the fifth input end E of the first five input lookup table, which is used to select the fifth input signal or the carry input signal to output.

It should be clarified that in the embodiment of this application, the third selection circuit can not only be the third multiplexer 03, but also other complex circuits with selective output functions, if circuit cost and efficiency are not considered in the circuit design process.

The second lookup table circuit is used for generating and outputting a carry propagation signal and a carry generation signal based on the received input signal, and selecting a carry propagation signal or a carry generation signal as the second output signal to output. Specifically, the value of the carry propagation signal and the value of the carry generation signal are determined by the value of the input signal received by the second lookup table circuit.

Figure 5:
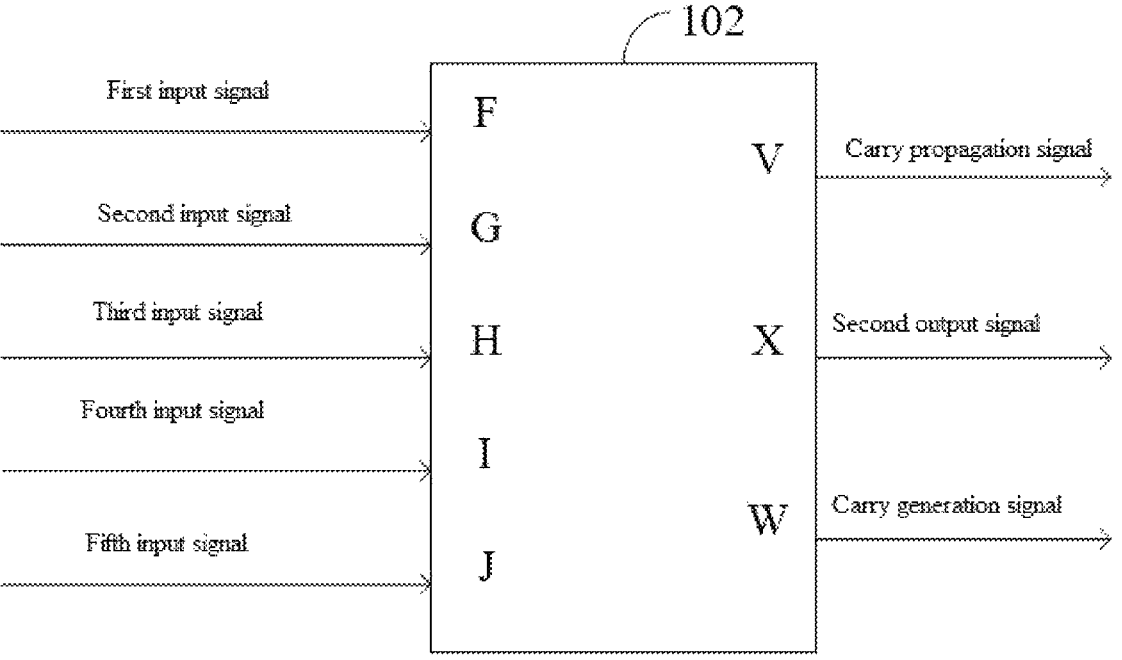
FIG. 5 illustrates a schematic diagram of the second lookup table circuit provided in the present embodiment.

In the embodiment, FIG. 5 illustrates a schematic diagram of the second lookup table circuit provided in the present embodiment, as shown in FIG. 5, the second lookup table circuit includes a second five input lookup table 102;

the first to fifth input ends (F, G, H, I, J) of the second five input lookup table 102 are used to receive the first to fifth input signals, respectively. The first output terminal V of the 25th input lookup table 102 is used to output the carry propagation signal, the second output terminal W of the second five input lookup table 102 is used to output the carry generation signal, and the third output end X of the second five input lookup table 102 is used to output the second output signal.

In the present embodiment, the first five input lookup table 101 and the second five input lookup table 102 reuse the first to fifth input signals.

In the present embodiment, the second lookup table circuit determines the value of the output first output signal based on the received input signal. The second lookup table circuit is not always applied to the first to fifth inputs in any application. When the programmable logic circuit in the present embodiment is used as an adder to perform two binary number addition, the second lookup table circuit will only be applied to two input terminals to receive the addition value, and one input end will receive an input signal to select the output signal of the third output end of the second lookup table circuit.

The first selection circuit is used for receiving a carry input signal and a carry generation signal, and select the carry input signal or the carry generation signal as the carry output signal to output based on the carry propagation signal.

Figure 6:
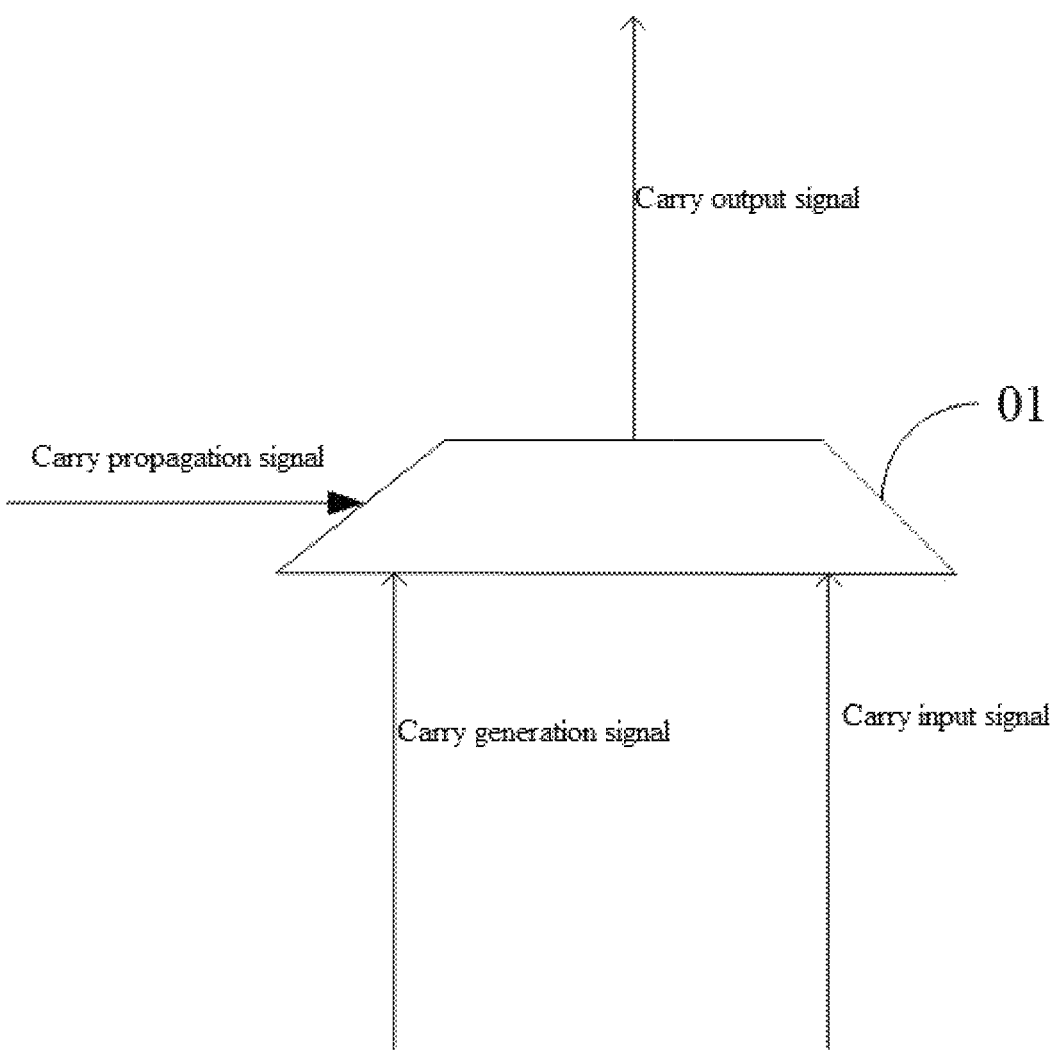
FIG. 6 illustrates a schematic diagram of the first selection circuit provided in the present embodiment.

In the embodiment, FIG. 6 illustrates a schematic diagram of the first selection circuit provided in the present embodiment, as shown in FIG. 6, the first selection circuit comprises a first multiplexer 01, where the first input end of the first multiplexer 01 is connected to the second output end W of the second five input lookup table 102 is used for receiving he carry generation signal, the second input end of the first multiplexer 01 is connected to the third output terminal X of the second five input lookup table 102 is used for receiving the carry input signal, the selection end of the first multiplexer 01 is connected to the first output end V of the second five input lookup table 102 is used for receiving the carry propagation signal, the output end of the first multiplexer 01 is used for selecting the carry generation signal or the carry input signal as the carry output signal to output based on the carry propagation signal. Specifically, the output end of the first multiplexer 01 determines the output signal based on the value of the carry propagation signal. When the value of the carry propagation signal is set to 0, the first multiplexer 01 selects the carry generation signal as the carry output signal to output. When the value of the carry propagation signal is 1, the first multiplexer 01 selects the carry input signal as the carry output signal to output.

The second selection circuit is used to receive the first output signal and the second output signal, and selects the first output signal or the second output signal as the third output signal to output based on the selection output signal.

Figure 7:
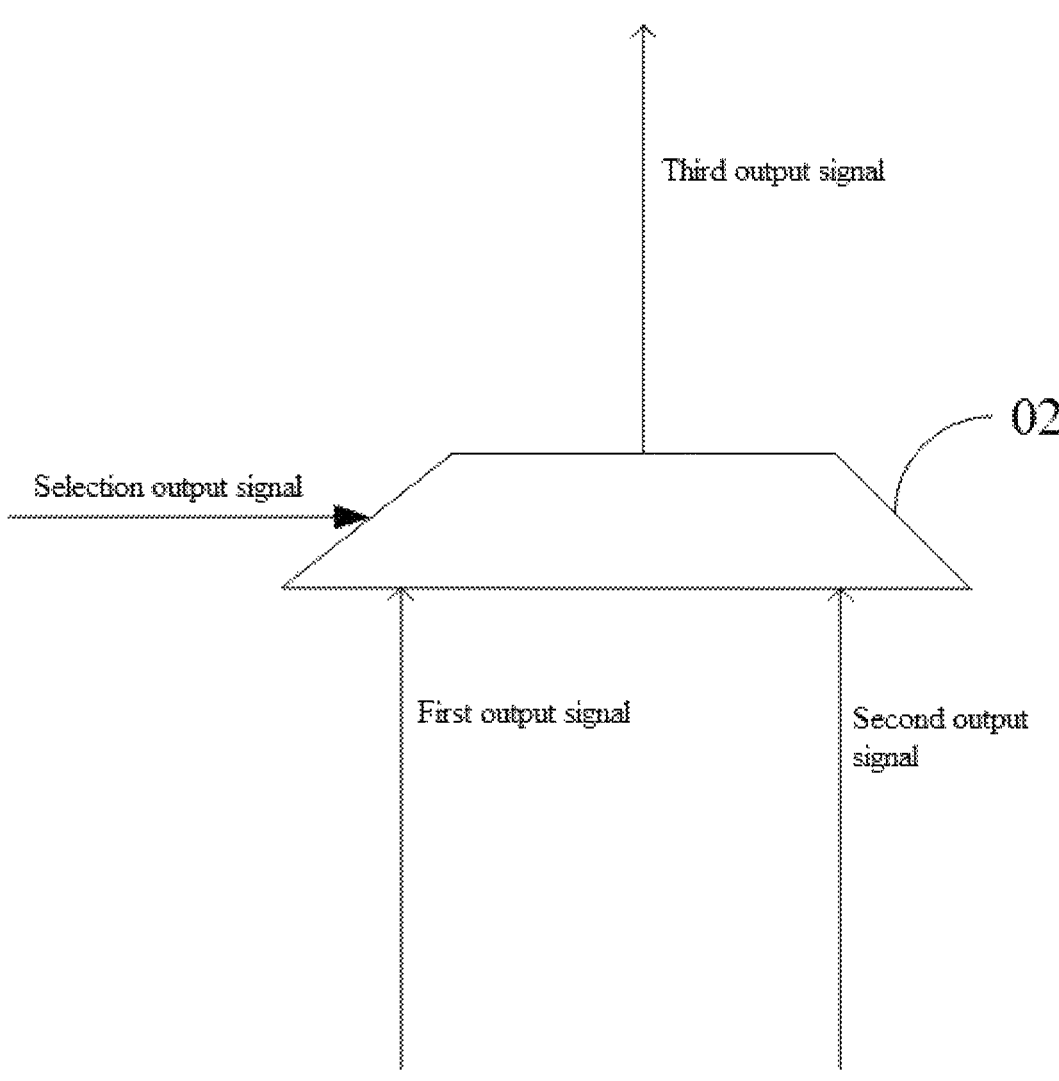
FIG. 7 illustrates a schematic diagram of the second selection circuit provided in the present embodiment.

In the embodiment, FIG. 7 illustrates a schematic diagram of the second selection circuit provided in the present embodiment, as shown in FIG. 7, wherein the second selection circuit comprises a second multiplexer 02;

the first input end of the second multiplexer 02 is connected to the output end Y of the first five input lookup table 101 to receive the first output signal. The second input end of the second multiplexer 02 is connected to the third output terminal X of the second five input lookup table 102 to receive the second output signal. The selection end of the second multiplexer 02 is used to receive the selection output signal. The output end of the second multiplexer 02 is used to select the first output signal or the second output signal as the third output signal to output based on the selection output signal. Specifically, the output end of the second multiplexer 02 determines the output signal based on the value of the selection output signal, when the value of the selection output signal is set to 0, the second multiplexer 02 selects the first output signal as the third output signal to output, when the value of the selection output signal is 1, the second multiplexer 02 selects the second output signal as the third output signal to output.

The programmable logic circuit provided in the present embodiment, When the programmable logic circuit is used as an adder for addition and subtraction operations, the carry generation signal is no longer limited to a single input variable and can perform addition and subtraction operations on multivariate functions, improving the configuration flexibility and logic resource utilization efficiency of the programmable logic device in addition operation mode; and the programmable logic circuit provided in the present embodiment, the first output signal of the first lookup table circuit is the result of addition operation, the second output signal of the second lookup table circuit can also be one of the addends of addition operation, and the second selection circuit selects the first output signal or the second output signal to output, so that the programmable logic circuit can choose to output the result of addition operation or the addition value of addition operation; in addition, the programmable logic circuit provided in the embodiment of the present application, wherein the first lookup table circuit can directly output the first output signal, the second lookup table circuit can directly output the second output signal, and the second selection circuit can select the first output signal or the second output signal as the third output signal to output, achieves independent output of the first lookup table circuit and the second lookup table circuit, allowing the programmable logic circuit to be configured to include up to three outputs.

The following is an example to illustrate the application of the programmable logic circuit provided in the present embodiment as an adder.

Figure 8:
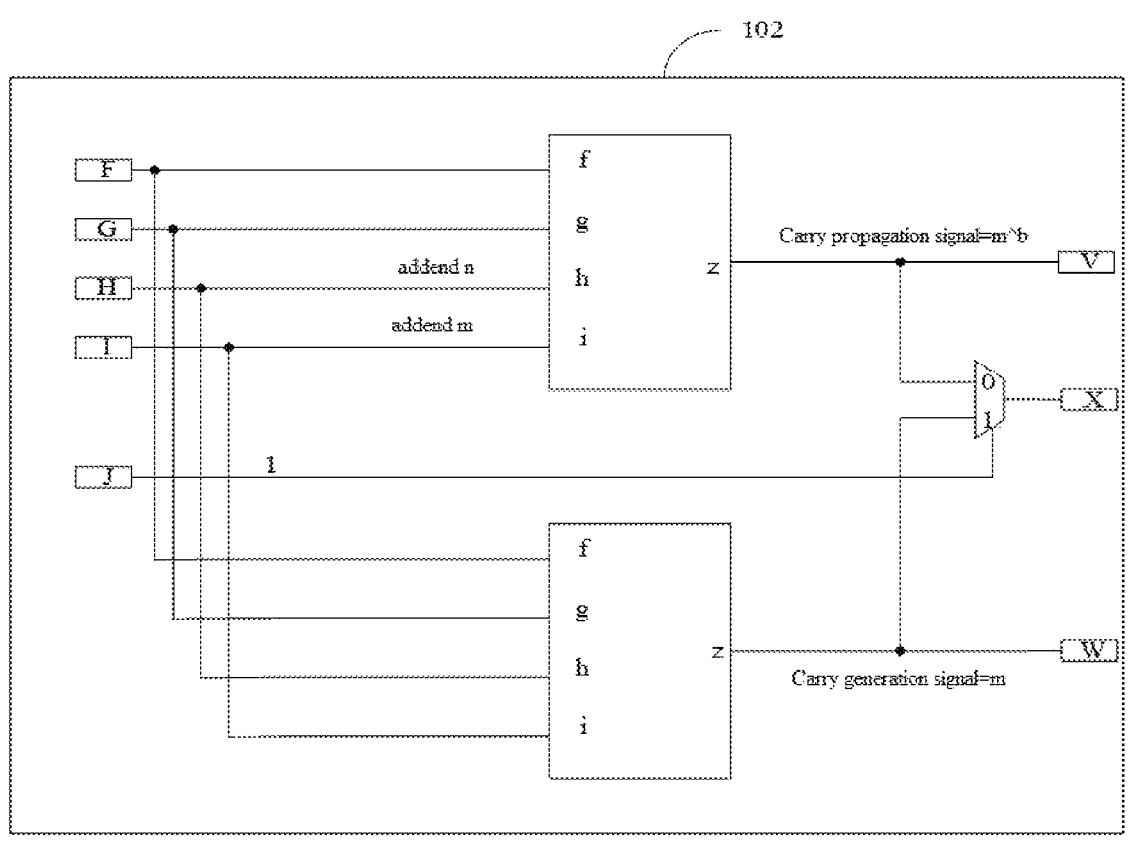
FIG. 8 illustrates a schematic diagram of the structure of the first five input lookup table and the second five input lookup table provided in the present embodiment.
Figure 8:
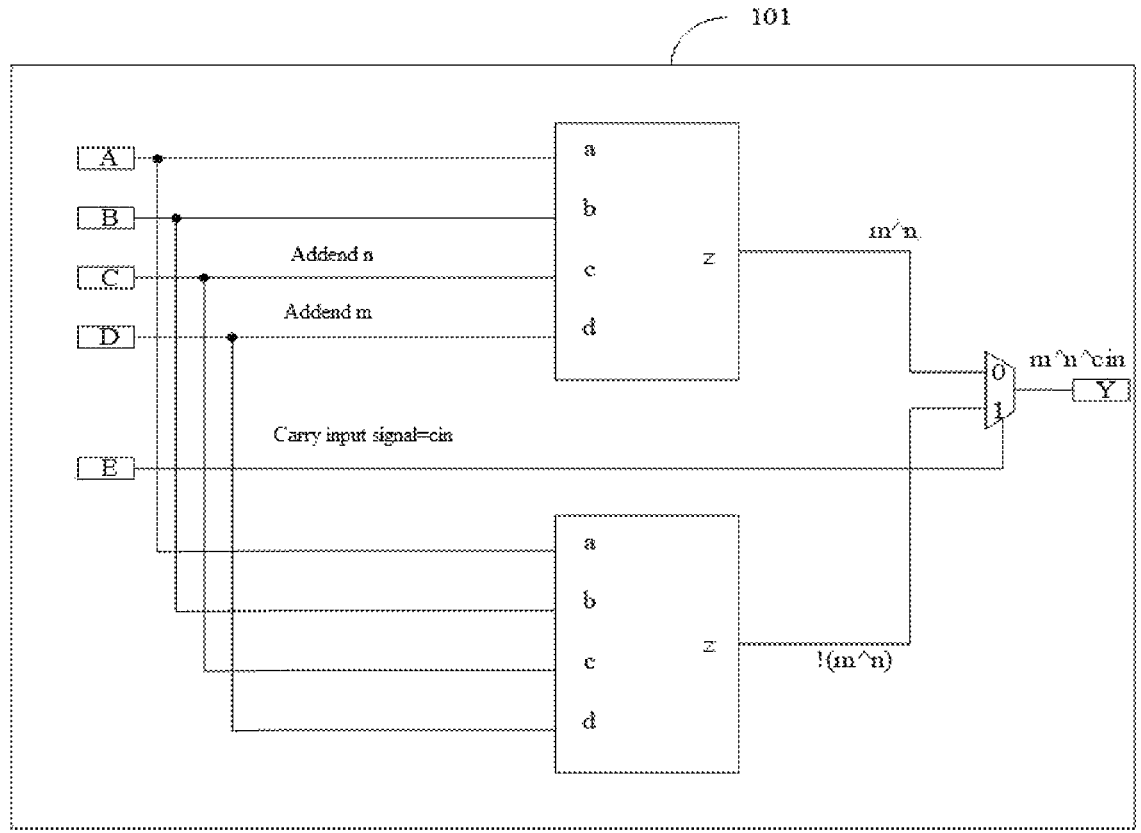

FIG. 8 shows a schematic diagram of the structure of the first five input lookup table and the second five input lookup table provided in the present embodiment, as shown in FIG. 8, the first five input lookup table 101 applies the third input end C and the fourth input end D to receive the two addends m and n of the input, and applies the fifth input terminal E to receive the carry input signal cin, perform addition and sum operations on m and n, the two four input lookup tables are used to calculate $m \hat{\ } n$ and $!(m \hat{\ } n)$, respectively, therefore, the signal output by the output end Y of the first five input lookup table 101 is the operation result $m \hat{\ } n \hat{\ } cin$;

The second five input lookup table 102 apply the third input end H and the fourth input end I to receive two addends m and n, the fifth input end J to receive value 1, and the two four input lookup tables are used for calculating the carry propagation signal $m \hat{\ } n$ and the carry generation signal $m \& \& n$, respectively. Because the carry generation signal is only selected and output by the first selection circuit when the carry propagation signal is 0, and a carry propagation signal of 0 indicates that the addend m is equal to the addend n, therefore, when the carry propagation signal is 0, it indicates that the carry generation signal is any addend, the third output end of the second five input lookup table 102 selects the carry generation signal to output based on the received value 1. The first lookup table circuit, on the premise of being connected to the second selection circuit, can simplify the carry generation signal into any addend of an addition operation;

In the above explanation, " $\hat{\ }$ " represents logical XOR, "&&" represents logical AND, and "!" represents logical NOT.

Further, the programmable logic circuit selects the output signal such that the third output signal output by the second selection circuit is the result of an addition operation or any addend, in order to achieve a binary expression.

Figure 9:
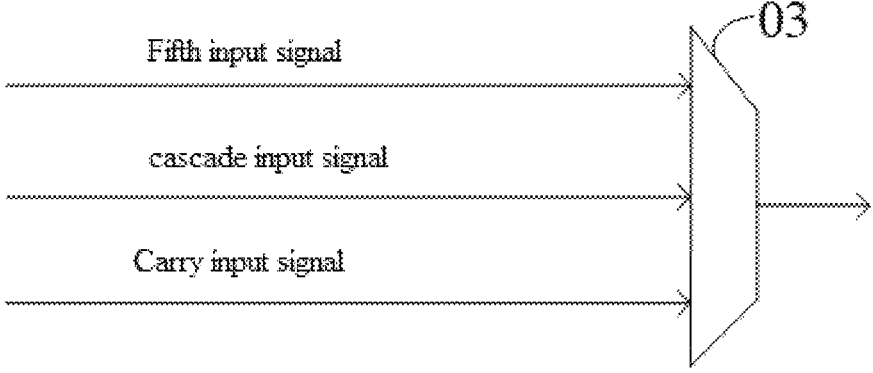
FIG. 9 illustrates a schematic diagram of the third selection circuit provided in the present embodiment.

It should be clarified that, as shown in FIG. 8, the two four input lookup tables that make up the first five input lookup table 101 have input port diagrams marked as a, b, c, and d, each mark is only used to facilitate the display of the internal structure of the first five input lookup table 101 for the purpose of explaining the embodiments of the present application. Similarly, the two four input lookup table that make up the second five input lookup table 102 have input port diagrams marked as f, g, h, i, and output port diagrams marked as z, and each mark is only used to facilitate the display of the internal structure of the second five input lookup table 102 for the purpose of explaining the embodiments of the present application. In some embodiments, FIG. 9 illustrates a schematic diagram of the third selection circuit provided in the present embodiment, as shown in FIG. 9, in the programmable logic circuit provided in the present embodiment, the third multiplexer 03 included in the third selection circuit is also used to receive a cascade input signal to output one of the cascade input signal, the fifth input signal, and the carry input signal to the first lookup table circuit.

Figure 10:
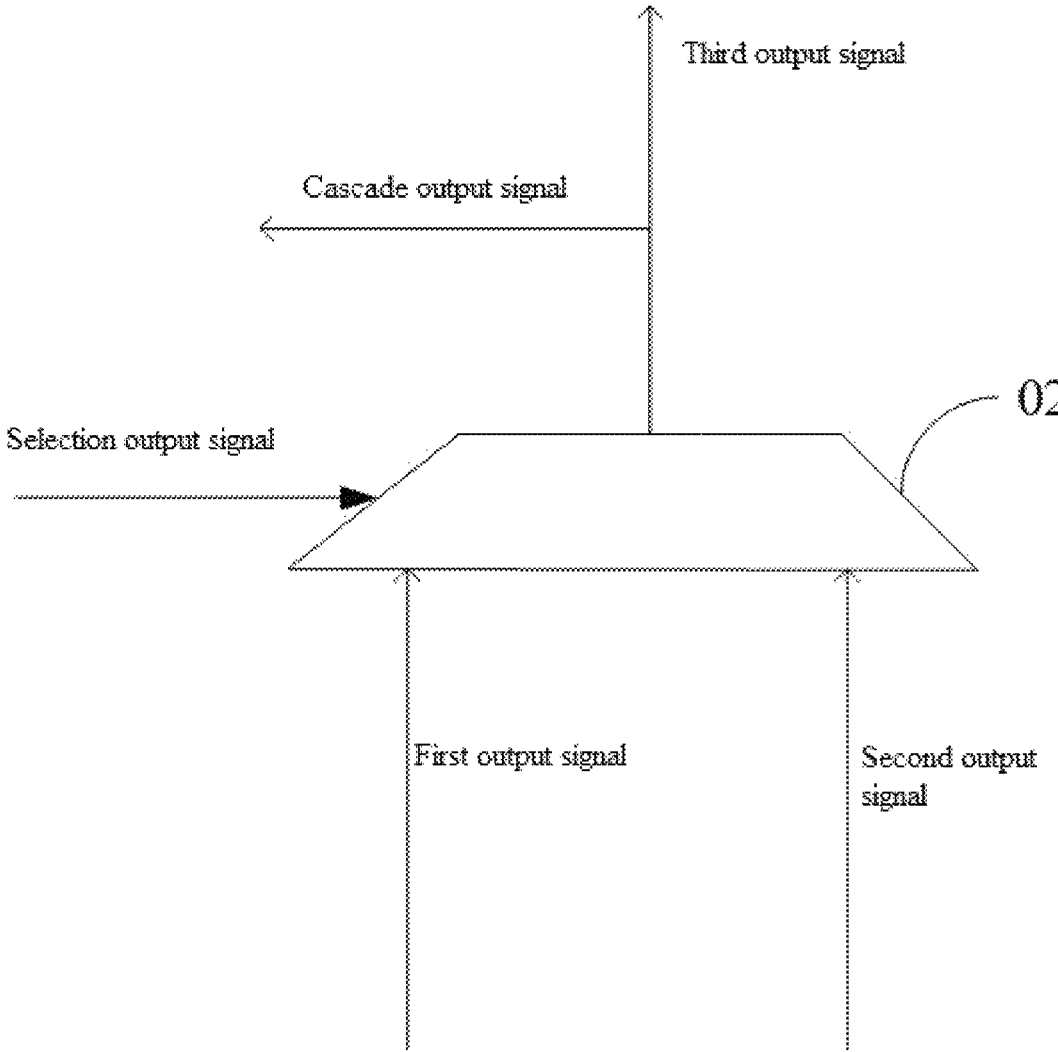
FIG. 10 illustrates another schematic diagram of the second selection circuit provided in the present embodiment.

FIG. 10 illustrates another schematic diagram of the second selection circuit provided in the present embodiment, as shown in FIG. 10, in the programmable logic circuit provided in the present embodiment, the second multiplexer 02 included in the second selection circuit is also used for outputting the selected first output signal or second output signal as a cascade output signal.

The programmable logic circuit provided in the present embodiment further includes the dual link feature of the lookup table cascade chain and the carry chain, and can also be used to achieve the function of using the programmable logic circuit as a dual comparator, in order to improve the logic resource utilization efficiency of the programmable logic circuit in comparator mode, the following examples will explain the dual comparator function of the present embodiment.

Figure 11:
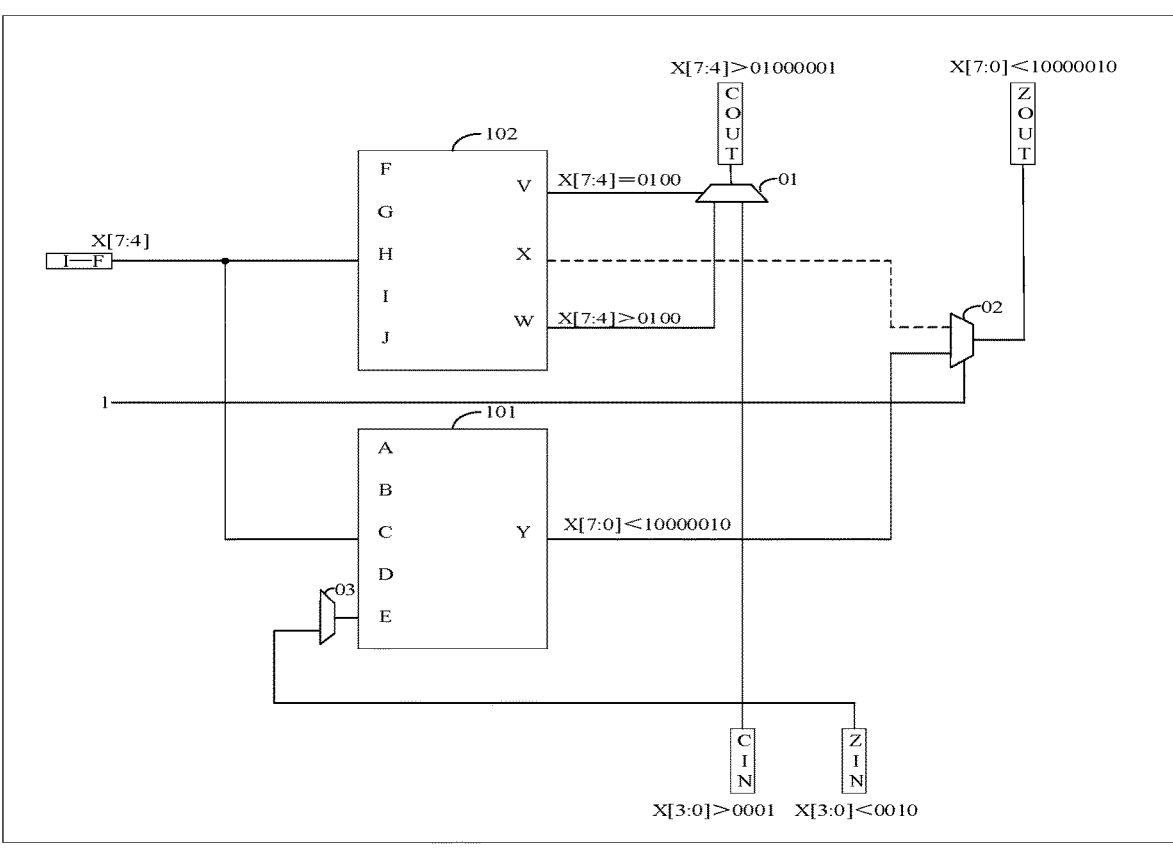
FIG. 11 illustrates a schematic diagram of a programmable logic circuit implementing a dual comparator provided in the present embodiment.
Figure 11:
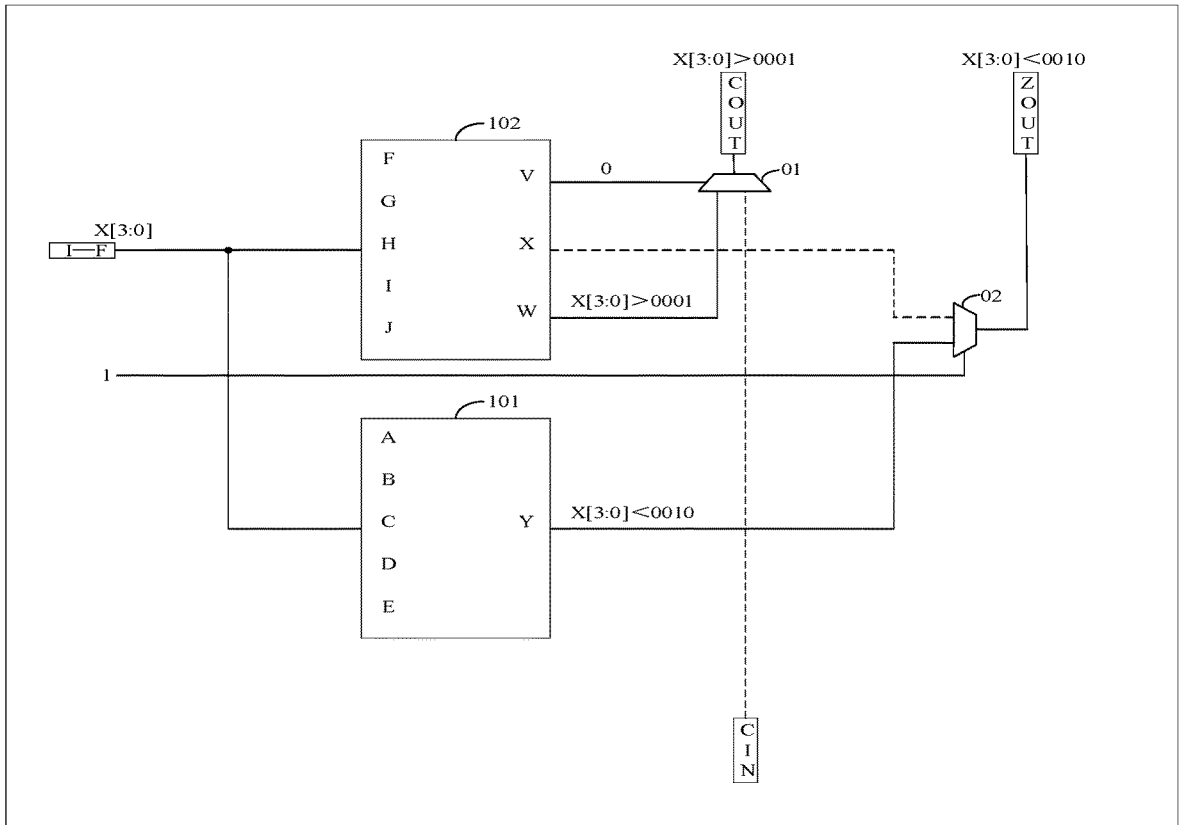

Taking the comparison between X[7:0]>01000001 and X[7:0]<10000010 as an example, the above comparison is achieved by setting up two cascade programmable logic circuits. X[7:0] represents an eight bit binary number X from high to low, FIG. 11 illustrates a schematic diagram of a programmable logic circuit implementing a dual comparator provided in the present embodiment, as shown in FIG. 11, in the first stage programmable logic circuit, the fourth to first inputs (I, H, G, F) of the second five input lookup table 102 respectively receive four binary numbers X[3:0], and the second five input lookup table 102 calculates the authenticity of X[3:0]>0001. Generate a signal through the carry output from the second output terminal W, the carry generation signal indicates the authenticity of X[3:0]>0001, if the carry generation signal is 1, it indicates that X[3:0]>0001 is true, and if the carry generation signal is 0, it indicates that X[3:0]>0001 is false, the value of the carry propagation signal output from the first output end V of the second five input lookup table 102 is 0, the first selection circuit selects the carry generation signal to output based on the carry propagation signal and uses it as the carry input signal for the second stage programmable logic circuit;

In the first stage programmable logic circuit, the fourth to first input ends (D, C, B, A) of the first five input lookup table 101 receive four binary numbers X[3:0], the first five input lookup table 101 calculate the authenticity of X[3:0] <0010, for example, if the output end Y of the first five input lookup table 101 outputs the first output signal value of 1, it means that X[3:0]<0010 is true, if the first output signal value is 0, it means that X[3:0]<0010 is false. The selection output signal value of the second selection circuit is 1, the second selection circuit selects the first output signal to output, and this first output signal serves as the cascade input signal of the second level programmable logic circuit;

As shown in FIG. 11, in the second stage programmable logic circuit, the fourth to first input ends (I, H, G, F) of the second five input lookup table 102 receive four binary numbers X[7:4]. The second five input lookup table 102 calculates the truth or falsehood of the carry propagation signal X[7:4]=0100 (=represents equal comparison) and outputs it to the first selection circuit through the first output port V. The second five input lookup table 102 calculates the truth or falsehood of the carry generation signal X[7:4]>0100 and outputs it to the first selection circuit through the second output port W. The first selection circuit determines whether to output the carry generation signal or the carry input signal (X[3:0]>0001) from the first stage programmable logic circuit based on the value of the carry propagation signal, if the carry propagation signal is 0, the carry generation signal is output, if the carry propagation signal is 1, the carry input signal from the first stage programmable logic circuit is output; for example, if the carry propagation signal is 0 and the carry generation signal is 1, then the first selection circuit outputs the carry generation signal, indicating that X[7:0]>01000001 is true;

In the second stage programmable logic circuit, the fourth to first inputs (D, C, B, A) of the first five input lookup table 101 receive four binary numbers X[7:4]. The fifth input of the first five input lookup table 101 receives a cascade input signal (X[3:0]<0010) from the first stage programmable logic circuit. The first five input lookup table 101 uses a five input function (X[7:4]=1000)? (X[3:0]<0010): (X[7:4]

<1000), calculate the result of the comparator X[7:0] <10000010. The above expression indicates that X[7:4]=1000 is true, and the output X[3:0]<0010 is true or false, X[7:4]=1000 is false, and the output X[7:4]<1000 is true or false, and the comparison result is output as a cascade output signal through the second selection circuit, the selection output signal received by the second selection circuit is 1, indicating that the second selection circuit selects the output signal to output of the first five input lookup table 101.

Figures 12, 13:
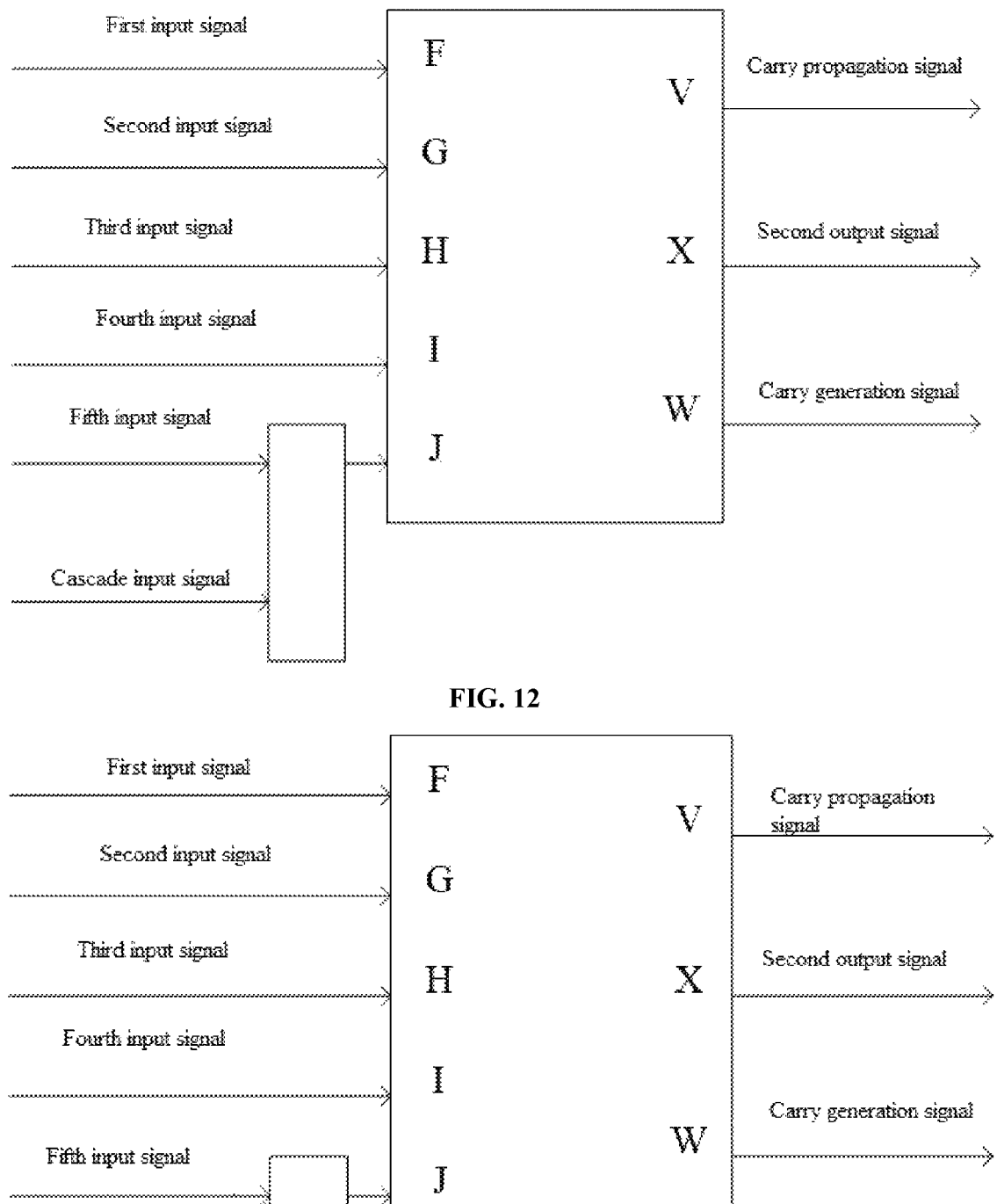
FIG. 12 illustrates another schematic diagram of the second lookup table circuit provided in the present embodiment.
FIG. 13 illustrates another schematic diagram of the second lookup table circuit provided in the present embodiment.

In the embodiment, FIG. 12 illustrates another schematic diagram of the second lookup table circuit provided in the present embodiment, as shown in FIG. 12, the second lookup table circuit further comprises a fourth selection circuit for receiving a fifth input signal and a cascade input signal, selecting the fifth input signal or the cascade input signal to output.

The programmable logic circuit provided in the present embodiment, when multiple programmable logic circuits are arranged for cascading, the cascade input signal is input by the first lookup table circuit and the second lookup table circuit, and the cascade output signal is output by the second selection circuit, improving the interconnection delay between programmable logic circuits.

In the embodiment, FIG. 13 illustrates another schematic diagram of the second lookup table circuit provided in the present embodiment, as shown in FIG. 13, the fourth selection circuit is also used to receive a sixth input signal to select one of the sixth input signal, the fifth input signal, and the cascade input signal to output to the fifth input end of the second fifth input lookup table 102.

Figure 14:
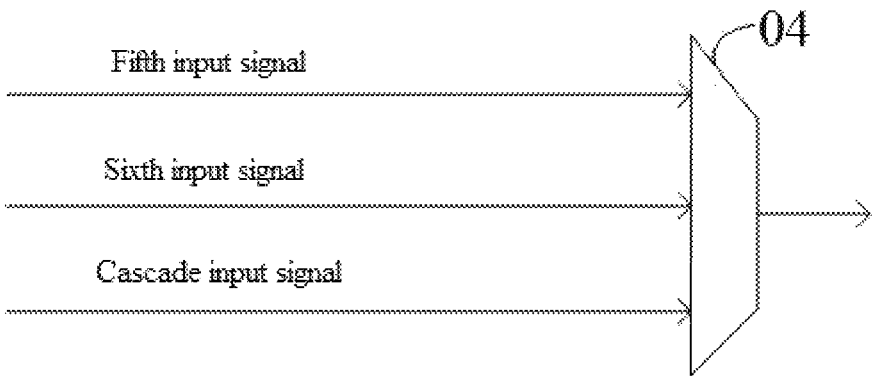
FIG. 14 illustrates a schematic diagram of the fourth selection circuit provided in the present embodiment.

In the embodiment, FIG. 14 illustrates a schematic diagram of the fourth selection circuit provided in the present embodiment, as shown in FIG. 14, the fourth selection circuit comprises: a fourth multiplexer 04, a first input end of the fourth multiplexer 04 for receiving a fifth input signal, a second input end of the fourth multiplexer 04 for receiving a sixth input signal, a third input end of the fourth multiplexer 04 for receiving a cascade input signal, and an output end of the fourth multiplexer 04 for selecting one of the fifth input signal, the sixth input signal, and the cascade input signal to output to the fifth input end J of the second five input lookup table 102.

The programmable logic circuit provided in the present embodiment adds input variables for the first lookup table circuit and the second lookup table circuit, so that the programmable logic circuit can be configured with up to seven input variables (input variables include: first to sixth input signals, carry input signals, and cascade input signals).

In the embodiment, the programmable logic circuit provided in the present embodiment, the selection ends of the third multiplexer 03 and the fourth multiplexer 04 are both programmed to control the output signal of their output end, the programming methods of the selection ends at least include SRAM programming, Flash programming, fuse programming, and anti fuse programming, specifically, the programming method of the multiplexer selection end is a conventional means, which will not be further described in this application.

Figure 15:
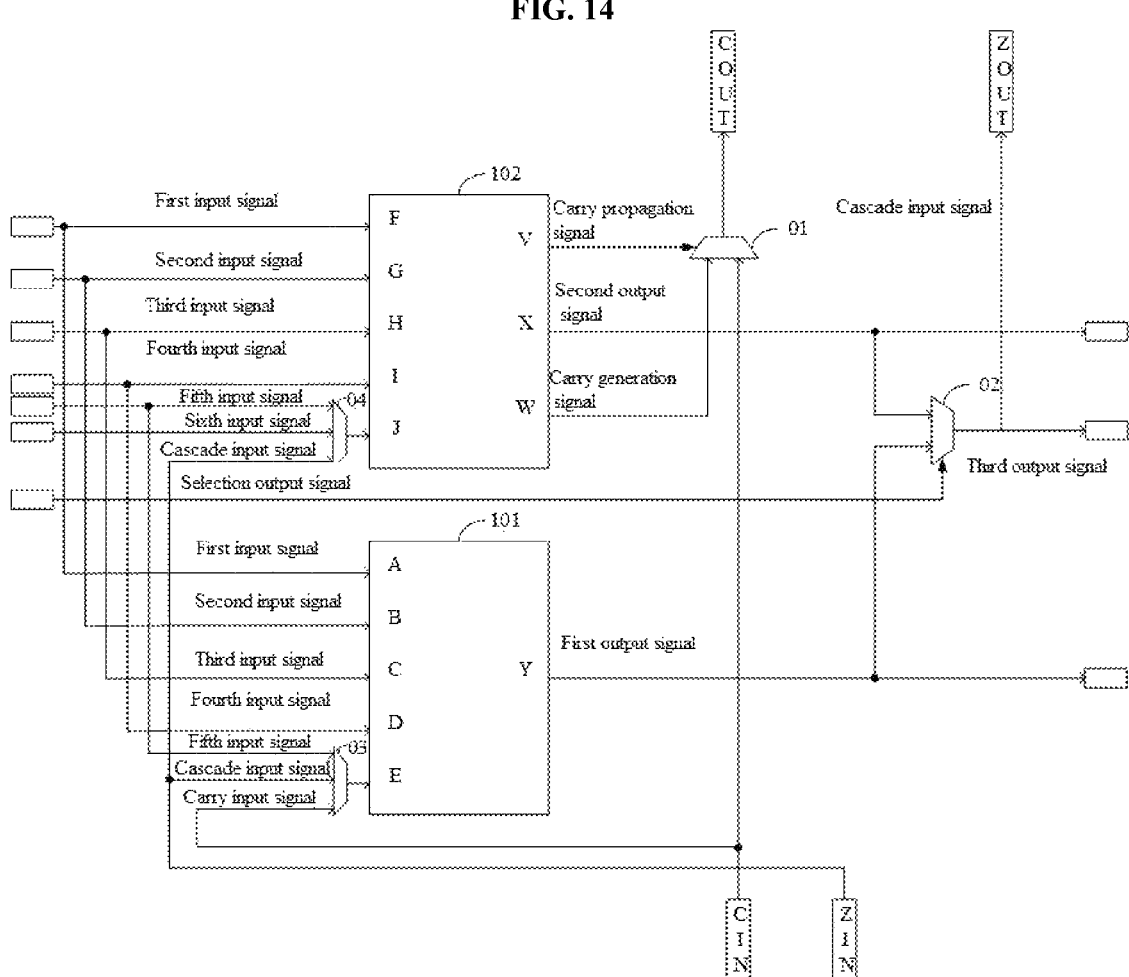
FIG. 15 illustrates a schematic diagram of the structure of the programmable logic circuit provided in the present embodiment.

FIG. 15 illustrates a schematic diagram of the structure of the programmable logic circuit provided in the present embodiment, based on the programmable logic circuit shown in FIG. 15, it can be used to implement the functions of any of the programmable logic circuits described above.

It should be clarified that the programmable logic circuit provided in the embodiments of this application, the first to sixth input signals and selection output signals can also be transmitted from external modules/circuits to programmable logic circuits by setting corresponding circuit ports, the first output signal, second output signal, and third output signal of programmable logic circuits can also be transmitted to corresponding circuit ports for interaction with external circuits. Similarly, carry input signals, carry output signals, cascade input signals, and cascade output signals can also be set with corresponding ports for connection between adjacent programmable logic circuits.

The programmable logic circuit provided in the present embodiment, when the programmable logic circuit is used as an adder for addition and subtraction operations, the carry generation signal is no longer limited to a single input variable and can perform addition and subtraction operations on multivariate functions, improving the configuration flexibility and logic resource utilization efficiency of the programmable logic device in addition operation mode;

The programmable logic circuit provided in the present embodiment, wherein the first output signal of the first lookup table circuit is the result of an addition operation, the second output signal of the second lookup table circuit can also be one of the addends of an addition operation, and the second selection circuit selects the first output signal or the second output signal to output, enable programmable logic circuits to select the output of addition results or the addition value of addition operations;

The programmable logic circuit provided in the embodiment of the present application, wherein the first lookup table circuit can directly output the first output signal, the second lookup table circuit can directly output the second output signal, and the second selection circuit can select the first output signal or the second output signal as the third output signal to output, achieves independent output of the first lookup table circuit and the second lookup table circuit, allowing the programmable logic circuit to be configured to include up to three outputs;

Further, the programmable logic circuit provided in the present embodiment further includes the dual link feature of the lookup table cascade chain and the carry chain, and can also be used to achieve the function of using the programmable logic circuit as a dual comparator, in order to improve the logic resource utilization efficiency of the programmable logic circuit in comparator mode, the following examples will explain the dual comparator function of the present embodiment.

Further, the programmable logic circuit provided in the present embodiment, when multiple programmable logic circuits are arranged for cascading, the cascade input signal is input by the first lookup table circuit and the second lookup table circuit, and the cascade output signal is output by the second selection circuit, improving the interconnection delay between programmable logic circuits.

Further, the programmable logic circuit provided in the present embodiment adds input variables for the first and second lookup table circuits, allowing the programmable logic circuit to be configured with up to seven input variables.

The above content is a further detailed explanation of the present application in combination with specific implementation methods, and it cannot be determined that the specific implementation of the present application is limited to these explanations. For those of ordinary skill in the art to which the present application belongs, several simple deductions or substitutions can be made without departing from the concept of the present application, and all of them should be considered as the scope of protection of the present application.

What is claimed is:

1. A programmable logic circuit, comprising: a first lookup table circuit, the first lookup table circuit is used for generating a first output signal based on a received input signal and outputting the first output signal; a second lookup table circuit, the second lookup table circuit is used for generating and outputting a carry propagation signal and a carry generation signal based on a received input signal, and selecting the carry propagation signal or the carry generation signal as a second output signal to output; a first selection circuit, the first selection circuit is used for receiving a carry input signal and the carry generation signal, and selecting the carry input signal or the carry generation signal as a carry output signal based on the carry propagation signal; a second selection circuit, the second selection circuit is used for receiving the first output signal and the second output signal, and selecting the first output signal or the second output signal as a third output signal based on a selection output signal.

2. The programmable logic circuit of claim 1, wherein the first lookup table circuit comprises a first five input lookup table and a third selection circuit, the first to fourth input ends of the first five input lookup table are respectively used for receiving the first to fourth input signals, a fifth input end of the first five input lookup table is used for receiving a signal output by the third selection circuit, an output end of the first five input lookup table is used for outputting the first output signal;

the third selection circuit is used for receiving a fifth input signal and the carry input signal, and selecting the fifth input signal or the carry input signal to output.

3. The programmable logic circuit of claim 2, wherein the third selection circuit is also used for receiving a cascade input signal to select one of the cascade input signal, the fifth input signal, and the carry input signal to output to a fifth input end of the first five input lookup table;

the second selection circuit is also used for using the selected the first output signal or the second output signal as a cascade output signal.

4. The programmable logic circuit of claim 1, wherein the second lookup table circuit comprises:

a second five input lookup table, the first to fourth input ends of the second five input lookup table are respectively used for receiving the first to fourth input signals, a fifth input end of the second five input lookup table is used for receiving a fifth input signal, a first output end of the second five input lookup table is used for outputting the carry propagation signal, a second output end of the second five input lookup table is used for outputting the carry generation signal, and a third output end of the second five input lookup table is used for outputting the second output signal.

5. The programmable logic circuit of claim 4, wherein the second lookup table circuit further comprises:

a fourth selection circuit, the fourth selection circuit is used for receiving the fifth input signal and a cascade input signal, selecting the fifth input signal or the cascade input signal to output, the signal output from the fourth selection circuit is used for determining the signal output from the third output end of the second five input lookup table.

6. The programmable logic circuit of claim 5, wherein the fourth selection circuit is also used for receiving a sixth input signal to select one of the sixth input signal, the fifth input signal, and the cascade input signal to output to a fifth input end of the second five input lookup table.

7. The programmable logic circuit of claim 1, wherein the first selection circuit comprises:

a first multiplexer, a first input end of the first multiplexer for receiving the carry generation signal, a second input end of the first multiplexer for receiving the second output signal, a selection end of the first multiplexer for receiving the carry propagation signal, and an output end of the first multiplexer for selecting the carry generation signal or the carry input signal as a carry output signal to output based on the carry propagation signal;

the second selection circuit comprises:

a second multiplexer, a first input end of the second multiplexer for receiving the first output signal, a second input of the second multiplexer for receiving the second output signal, a selection end of the second multiplexer for receiving the selection output signal, and the output end of the second multiplexer for selecting the first output signal or the second output signal as a third output signal to output based on the selection output signal.

8. The programmable logic circuit of claim 3, wherein third selection circuit comprises:

a third multiplexer, a first input end of the third multiplexer for receiving the fifth input signal, a second input end of the third multiplexer for receiving the carry input signal, and a third input end of the third multiplexer for receiving the cascade input signal, an output end of the third multiplexer for selecting one of the fifth input signal, the carry input signal, and the cascade input signal to output to the fifth input end of the first five input lookup table.

9. The programmable logic circuit of claim 6, wherein the fourth selection circuit comprises:

a fourth multiplexer, a first input end of the fourth multiplexer for receiving the fifth input signal, a second input end of the fourth multiplexer for receiving the sixth input signal, a third input end of the fourth multiplexer for receiving the cascade input signal, and an output of the fourth multiplexer for selecting one of the fifth input signal, the sixth input signal, and the cascade input signal to output to a fifth input of the second five input lookup table.

10. The programmable logic circuit of claim 8, wherein the selection ends of the third multiplexer and the fourth multiplexer are both programmed to control the signal output from their output end, the programming methods of the selection ends at least include SRAM programming, Flash programming, fuse programming and anti fuse programming.

11. The programmable logic circuit of claim 9, wherein the selection ends of the third multiplexer and the fourth multiplexer are both programmed to control the signal output from their output end, the programming methods of the selection ends at least include SRAM programming, Flash programming, fuse programming and anti fuse programming.

* * * * *